United States Patent
Jain et al.

(10) Patent No.: US 7,229,930 B2
(45) Date of Patent: Jun. 12, 2007

(54) SELECTIVE ETCHING OF LOW-K DIELECTRICS

(75) Inventors: Alok Jain, Singapore (SG); Phui Fah Chong, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 190 days.

(21) Appl. No.: 10/341,693

(22) Filed: Jan. 13, 2003

(65) Prior Publication Data

US 2004/0137748 A1    Jul. 15, 2004

(51) Int. Cl.
*H01L 21/302* (2006.01)

(52) U.S. Cl. ............... 438/714; 438/706; 438/710; 216/67

(58) Field of Classification Search ........... 438/706, 438/710, 712, 714, 720; 216/67, 68, 69
See application file for complete search history.

(56) References Cited

U.S. PATENT DOCUMENTS

| | | | |
|---|---|---|---|
| 5,300,460 A | | 4/1994 | Collins et al. |
| 5,338,399 A | | 8/1994 | Yanagida |
| 5,356,515 A | * | 10/1994 | Tahara et al. ............... 438/715 |
| 5,366,590 A | | 11/1994 | Kadomura |
| 6,040,248 A | * | 3/2000 | Chen et al. ................ 438/725 |
| 6,080,680 A | * | 6/2000 | Lee et al. .................. 438/727 |
| 6,174,451 B1 | | 1/2001 | Hung et al. |
| 6,211,092 B1 | | 4/2001 | Tang et al. |
| 6,326,307 B1 | | 12/2001 | Lindley et al. |
| 6,342,448 B1 | * | 1/2002 | Lin et al. ................... 438/687 |
| 6,362,109 B1 | | 3/2002 | Kim et al. |
| 6,403,491 B1 | | 6/2002 | Liu et al. |
| 6,455,411 B1 | * | 9/2002 | Jiang et al. ................. 438/624 |
| 6,485,988 B2 | * | 11/2002 | Ma et al. ..................... 438/3 |
| 6,635,335 B1 | * | 10/2003 | Donohoe et al. ............ 428/156 |
| 2004/0106293 A1 | * | 6/2004 | Igarashi ..................... 438/690 |

FOREIGN PATENT DOCUMENTS

| | | |
|---|---|---|
| JP | 276626 | 12/1991 |
| JP | 346428 | 12/1992 |
| JP | 191002 | 7/1997 |

OTHER PUBLICATIONS

A.P Mahorowala. K. Babich. Q. Lin. J. Vac. Sci. Technol. A 18(A). 1411 (00), no date available.
A. Yahata. Jpn. J. Appl. Phys. 40.116 (2001).
I. Pollentier et al., Semiconductor Fabtech. 13$^{th}$ ed.. pp. 227-234, no date available.
M. Naik et al., IEEE ITTC Proc., 1999. pp. 181-183.

* cited by examiner

*Primary Examiner*—Lan Vinh
(74) *Attorney, Agent, or Firm*—Patterson & Sheridan, LLP

(57) ABSTRACT

The present invention provides a low-k dielectric etching process with high etching selectivities with respect to adjacent layers of other materials, such as an overlying photoresist mask and an underlying barrier/liner layer. The process comprises the step of exposing a portion of the low-k dielectric layer to a plasma of a process gas that includes a fluorocarbon gas having a relatively low fluorine to carbon ratio, a nitrogen-containing gas, and an inert gas, wherein a volumetric flow ratio of the nitrogen-containing gas to the fluorocarbon gas is greater than about 20:1. The process can be used to over etch the low-k dielectric layer to provide improved selectivity to the photoresist mask and the barrier/liner layer, reduced striations and reduced CD loss as compared with conventional low-k dielectric etching processes.

20 Claims, 6 Drawing Sheets

SELECTIVE ETCHING OF LOW-K DIELECTRICS

The present application relates to semiconductor processing technologies, and particularly to etching patterns in a layer of dielectric material having low dielectric constant.

BACKGROUND

The maximum operating speed of current semiconductor devices is limited by the time delay factor T=RC of metal layers, where the resistance R is from the metal lines and the capacitance C is from the dielectric insulating material surrounding the metal lines. As the minimum feature size on integrated circuits shrinks below 0.18 µm, the metal lines become thinner and more densely packed, resulting in greater resistance in the metal lines and larger inter-metal capacitance, and therefore a longer time delay. By changing to different materials, i.e., higher conductivity material for the metal lines and lower permittivity (low-k) dielectric for the insulating material, device geometry can continue to shrink without adversely impacting the maximum operating speed. This prompted the switch from aluminum and silicon dioxide to copper and low-k dielectrics in the backend process flow for manufacturing many current and future semiconductor devices.

The switch from aluminum/oxide to copper/low-k involves a variety of fundamental changes in the backend manufacturing process flow. Since it is difficult to etch copper, new approaches such as "damascene" or "dual damascene" processing are required. Copper damascene/dual-damascene is a process where vias and trenches are etched into the insulating material. Copper is then filled into the vias and trenches and sanded back using a process such as chemical mechanical polishing (CMP), so the conducting materials are only left in the vias and trenches. Among the many challenges presented by this process, etching trenches or vias in low-k dielectrics can be tricky due to the more complicated chemical composition of the dielectric material and the many different kinds of low-k dielectric materials available. The etch chemistry for etching a low-k dielectric material may have to be tailored to match up with the amount of carbon, hydrogen, silicon, fluorine and oxygen in the material.

The ratio of the rate of etching a low-k dielectric layer to the rate of etching one of adjacent layers of other materials is called etching selectivity. A photoresist layer is typically used to mask the low-k dielectric layer during the dielectric etching process. Compared with traditional dielectric etching processes, selectively etching low-k dielectric materials requires more precise tuning of the process chemistry and process parameters because like photoresist, many low-k dielectric materials also contain some carbon and hydrogen, making it harder to achieve good selectivity. Poor selectivity to photoresist has been found to contribute to striations or rough surfaces on the sidewalls of etched micro-features. Striations are not desirable for optimum performance of the integrated circuits because the rough feature surfaces make metallization difficult. Poor selectivity to photoresist also contributes to loss of critical dimensions (CD), which has become less and less tolerable with the shrink of feature sizes.

SUMMARY

The present invention provides a low-k dielectric etching process with high etching selectivities with respect to adjacent layers of other materials, such as the overlying photoresist mask and an underlying barrier/liner layer. A process for etching the low-k dielectric layer comprises a main etch step, in which the substrate is exposed to a plasma of a first process gas that includes a fluorocarbon gas for a period of time. The main etch step is followed by an over etch step, in which the substrate is exposed to a plasma of a second process gas. The second process gas includes a fluorocarbon gas having lower fluorine to carbon ratio than the fluorocarbon gas in the first process gas. The second process gas also includes a nitrogen-containing gas. The volumetric flow ratio of nitrogen-containing gas to fluorocarbon gas in the second process gas is greater than 20:1. The over etch step provides a low-k dielectric to photoresist selectivity greater than about 4.8:1, a low-k dielectric to barrier/liner etching selectivity greater than about 6:1, and a low-k dielectric etch rate higher than 1400 Å/min.

DRAWINGS

Additional objects and features of the invention will be more readily apparent from the following detailed description and appended claims when taken in conjunction with the drawings, in which:

FIGS. 1(a), 1(b), 1(c) and 1(d) are schematic views in vertical cross-section of a low-k dielectric layer on a substrate at different stages of an etching process;

DESCRIPTION

Figure 1:
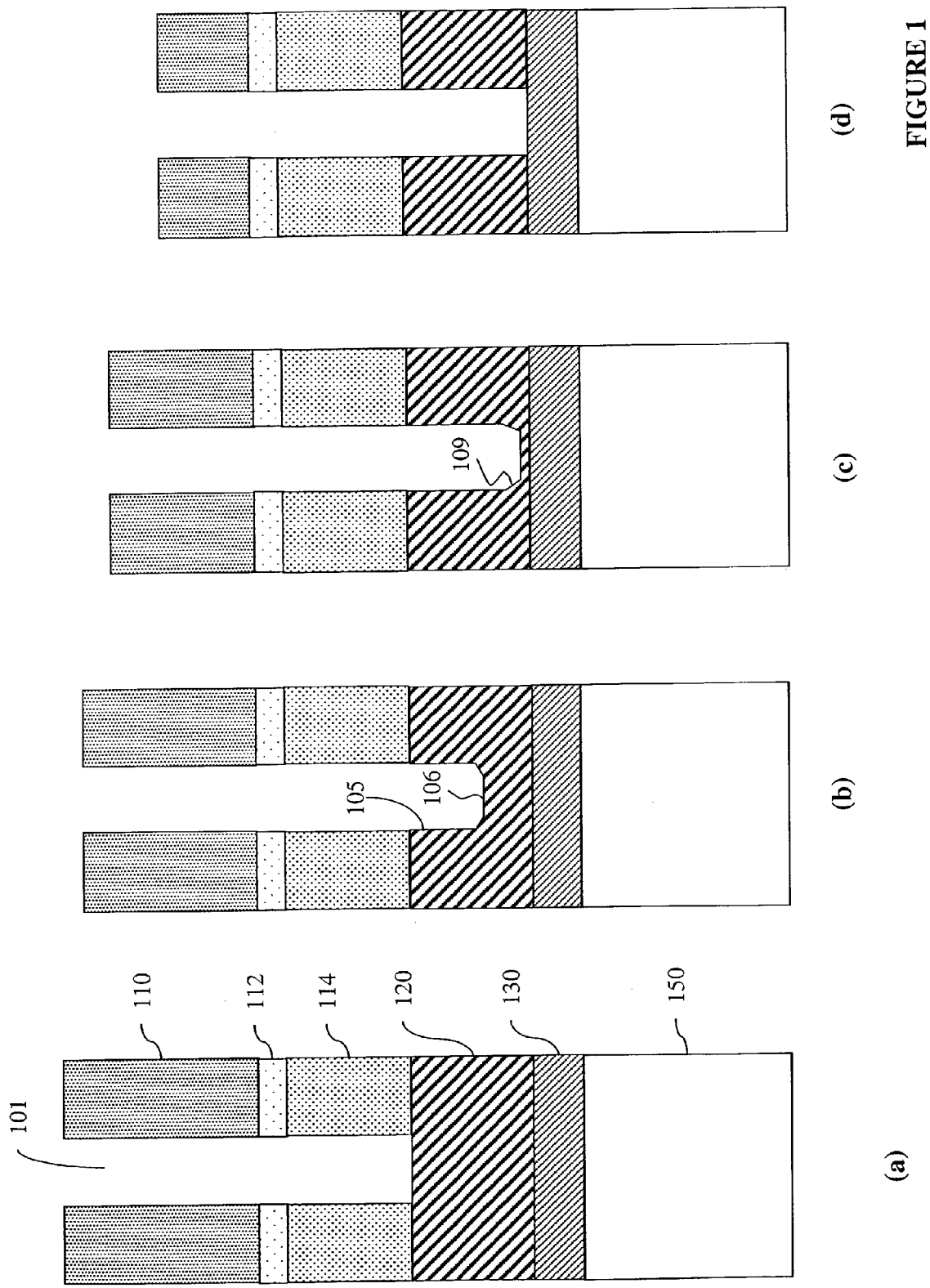

FIGS. 1(a), 1(b), 1(c) and 1(d) illustrate a low-k dielectric layer 120 on a substrate 150 at different, successive stages of a low-k dielectric etching process. A patterned mask layer such as photoresist 110 partially covers the dielectric layer 120 and defines the openings for features to be etched, such as feature 101. In some applications, a bottom anti reflective coating (BARC) layer 112 may lie between the mask layer 110 and the dielectric layer 120. The BARC layer helps obtain smaller geometries during the formation of the mask layer through its ability to eliminate reflected light from other layers and the substrate below the mask layer. A hard mask layer 114 may lie between the BARC layer 112 and the dielectric layer 120. The hard mask layer 114 is often used as a stop layer during the copper CMP process after features in the dielectric layer has been etched. The dielectric layer 120 may be separated from the substrate by a barrier/liner layer 130. Metal lines (not shown) may also lie beneath the barrier/liner layer.

In one embodiment of the present invention, the thickness of the mask layer 110 before etching is about 1930 Å to about 4750 Å, the thickness of the BARC layer 112 is about 900 Å, the thickness of the hard mask layer is about 2000 Å, the thickness of the low-k dielectric layer 120 is about 2000 Å to about 5000 Å, and the thickness of the barrier/liner layer is usually a few hundred Angstroms. As is apparent, these layers are not drawn to scale.

A dielectric etching process of the present invention is useful for etching the low-k dielectric layer 120 with good etch rate and high etching selectivity with respect to the mask layer 110 and the barrier/liner layer 130. As will be described in more detail below, the dielectric etching process is performed by exposing the uncovered portion of the low-k dielectric layer 120 to an energized gas, such as a plasma, comprising energetic and reactive species. The plasma is usually generated in a plasma reactor, such as, for example, the Dielectric Etch eMAX system, the Dielectric Etch Super e Centura system, or the Dielectric Etch IPS Centura system, all of them being commercially available from Applied Materials Inc., Santa Clara, Calif.

Figure 2:
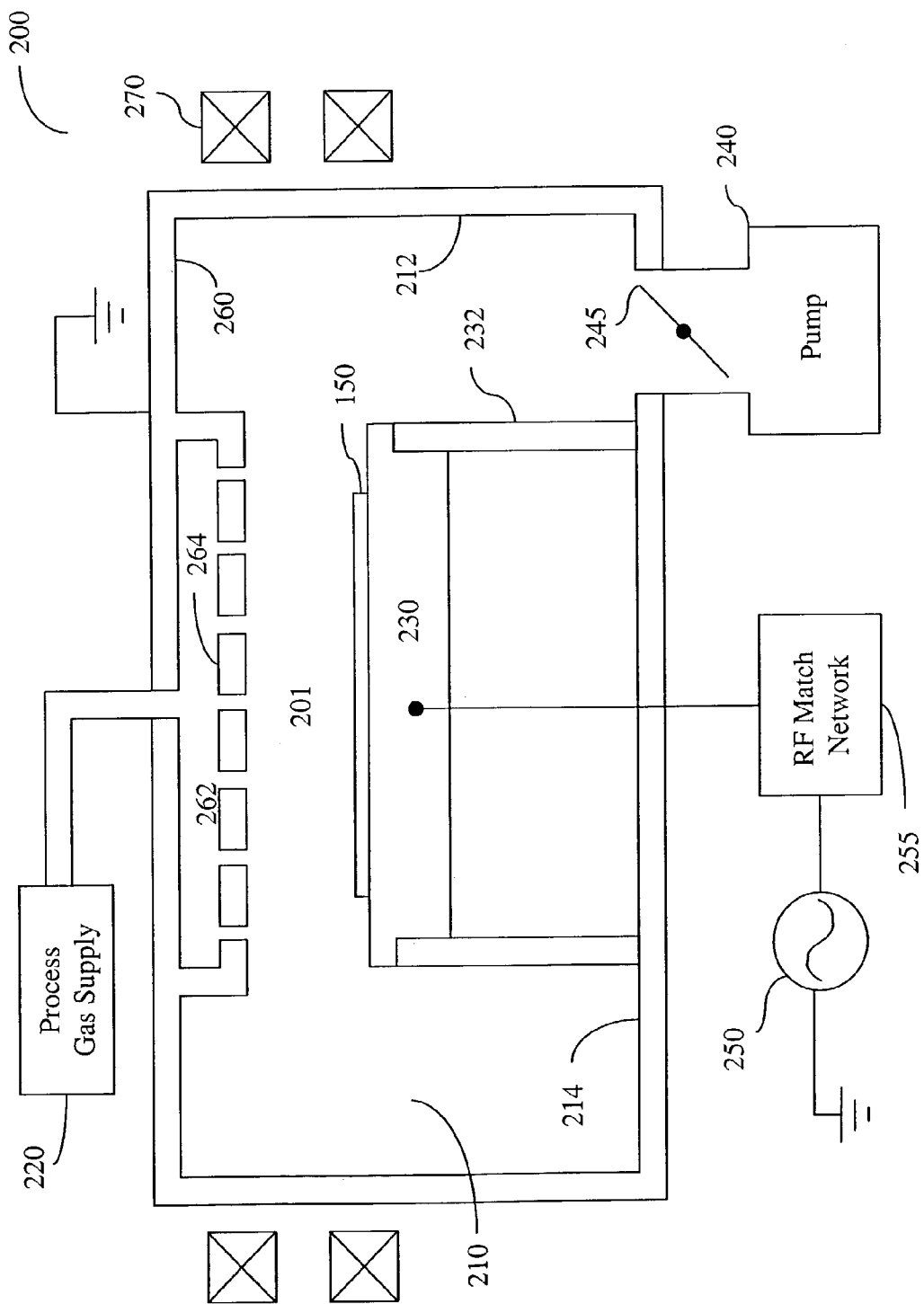
FIG. 2 is a schematic view in vertical cross-section of a plasma reactor used to practice a low-k dielectric etching process according to one embodiment of the present invention.

FIG. 2 illustrates in vertical cross-section an exemplary reactor 200 that can be used to practice the etching processes of the present invention. The reactor 200 comprises a chamber 210 enclosed by a wall 212, a base 214, and a ceiling 260. The chamber includes a process zone 201 comprising a volume of about 5,000 to about 50,000 cm3. The reactor 200 further comprises a process gas supply 220 that supplies process gases into the chamber 210 through a gas manifold 262 and a gas distribution plate (GDP) 264 at the ceiling 260 of the chamber 210. Spent process gas and volatile etch products are pumped out from the process chamber 210 by a pump 240. A throttle valve 245 controls the pressure in the chamber 210. The wall 212, the base 214, the ceiling 260, and the GDP 264 are usually made of aluminum with anodized aluminum coating on at least the surfaces facing the inside of the chamber 210. The chamber 210 further includes a pedestal 230 that supports the substrate 150 in the chamber 210. The pedestal 230 is electrically isolated from the base 214 by an insulator support ring 232 and is connected to a radio frequency (RF) power source 250 through an impedance match network 255. The wall 212, the base 214, the ceiling 260, and the GDP 264 are typically grounded. The reactor configuration of FIG. 2 thus facilitates reactive ion etching (RIE) processes, where RF voltage at a power level of about 100 to about 3000 Watts is applied to the pedestal 230 below the substrate 150 while the wall 212, the base 214, the ceiling 260, and the GDP 264 are grounded.

When reactor 200 is used to etch the low-k dielectric layer 120 on the substrate 150, chamber 210 is evacuated by pump 240 to a pressure of less than about 1 mTorr. The substrate is transferred into chamber 210 from a load lock transfer chamber (not shown) maintained at near vacuum, and is placed on the pedestal 230. The substrate can be held in place during the dielectric etching process using a mechanical or electrostatic chuck (not shown) with grooves in which a coolant gas, such as helium, is circulated to control the temperature of the substrate.

The BARC layer 112 and hard mask layer 114 may be etched also in processing chamber 210 using a conventional BARC etching process and a conventional hard mask etching process, respectively, prior to etching dielectric layer 120, so that the dielectric layer in feature 101 can be exposed to the plasma. During the etching of the dielectric layer 120, a process gas comprising one or more gaseous components is introduced into the chamber 210 through the GDP 264 above the substrate 150, the gas pressure in the chamber 210 is controlled at a desired level, and the RF power source 250 is turned on to maintain a plasma in the process zone 201. Impedance match network 255 may be tuned for efficient coupling between the RF power source 250 and the plasma in processing chamber 210. With the RF source 250 turned on, the pedestal 230 acts as a cathode electrode, while the grounded wall 212, ceiling 260 and the GDP 264 together serve as an anode electrode. The plasma is thus generated and maintained by capacitively coupled RF power between the cathode and the anode electrodes. A substantial DC bias typically exists between the plasma and the cathode electrode, resulting in energetic ion bombardment on the substrate. The plasma of the process gas is turned off after a predetermined time period or by using an optical endpoint measurement technique.

The plasma density, defined as the number of ions per unit volume, may be enhanced by placing plural magnets 270 around the chamber wall 212 to provide a slowly rotating magnetic field in the chamber 210. The magnets may be electromagnets driven with respective phases of a low frequency (e.g., 0.1–0.5 Hertz) AC current source (not shown). Alternatively, the magnets may be permanent magnets mounted on a slowly rotating support structure (not shown) rotating at, for example, 0.1–0.5 revolutions per second.

FIG. 2 only shows one configuration of the many plasma reactors that can be used to practice the present invention. For example, the reactor 200 may include other power sources in addition to or in place of the RF power source 250, and power can be coupled into the chamber 210 to strike and maintain a plasma therein through differently configured coupling hardware such as known in the art, without affecting the application of the present invention. For example, in addition to the power from the RF power source 250, an RF voltage can be applied to an inductor coil to inductively couple energy into the chamber 210 to maintain a higher plasma density in the process zone 201. The frequency of the RF power applied to the electrode 230 or the inductor coil is typically from about 50 KHz to about 60 MHz, and more typically about 13.56 MHz.

In one embodiment of the present invention, the dielectric etching process comprises a main etch step followed by an over etch step. FIG. 1(a) depicts the dielectric layer 120 at the beginning of the main etch step, FIG. 1(b) depicts the dielectric layer 120 in the middle of the main etch step, FIG. 1(c) depicts the dielectric layer 120 at the end of the main etch step or the beginning of the over etch step, and FIG. 1(d) depicts the dielectric layer 120 at the end of the over etch step. The main etch step advances the feature bottom surface 106 until it almost reaches the barrier/liner layer. The main etch step may run for a time period determined from etch rate data obtained from test runs, or it may run until an endpoint is detected by a conventional optical endpoint measurement device incorporated in the reactor used for the etching process.

The process gas used in the main etch step comprises one or more fluorocarbon gas having relatively high fluorine to carbon ratios, such as $CF_4$, $C_2F_6$, $C_3F_8$, $C_4F_{10}$, $C_4F_8$, $CHF_3$, etc. The fluorocarbon gas contributes fluorine and $CF_x$ species in the plasma that etch the dielectric layer 120 by reacting with the silicon and oxygen content in the dielectric layer 120 to form volatile etch products. For normal dielectrics such as silicon dioxide, the etching reaction may include, $$2CF_2 + SiO_2 \rightarrow SiF_4 + 2CO,$$

where the etch products $SiF_4$ and CO are both volatile and can be pumped out of the chamber 210. At the same time, some $CF_x$ species (x=1, 2, 3) may form polymeric passivating deposits on the feature surfaces by recombining with each other or with other species before reacting with the dielectric layer. Because the feature sidewalls 105 are subject to less ion bombardment from the plasma than the feature bottom surface 106, these passivating deposits accumulate more on the feature sidewalls 105, resulting in enhanced anisotropic etching.

Although sidewall passivation has proved to be helpful in achieving anisotropy, too much etch product deposits on the sidewall can cause problems such as striation, slow etch rate, or even etch stop. Thus the process gas in the main etch step may also comprise a nitrogen-containing gas, such as $N_2$, $NH_3$, $N_2O$, etc. The nitrogen-containing gas contributes to the nitrogen containing species in the plasma that react with some of the passivating deposits and etch product deposits on the feature surfaces to form volatile species such as CN that are pumped out from the process chamber 210. One advantage of using nitrogen-containing gas for the removal of deposits is that the nitrogen containing gas has low impact on the mask 110, which is typically made of a photoresist material.

The process gas in the main etch step may further comprise an inert gas. The inert gas helps to control the etched feature profile by contributing inert ions that impinge mostly on the bottom surface 106 of the etched features, activating chemical reactions thereon while leaving the sidewalls 105 of the features less affected. The inert ions also help to reduce etch product deposits by sputtering them off the feature surfaces. Suitable inert gases include argon, helium, neon, xenon, and krypton, of which argon is most often used.

The volumetric flow rate of each gas in the process gas depends on many factors, including the configuration of the reactor used to carry out the dielectric etching process, the size of the substrate, the thickness of the films and the specific gases used in the process gas. The volumetric flow ratios of the different gases in the process gas can also be tailored for different combinations of materials and to achieve specific etching selectivities, etch rates, or feature geometry without deviating from the scope of the present invention. In one embodiment of the present invention, when $CF_4$ is used as the fluorocarbon gas and $N_2$ is used as the nitrogen-containing gas in the main etch step, the volumetric flow ratio of $CF_4:N_2$ is about 4:1. When argon is used as the inert gas in the main etch step, the volumetric flow ratio of argon to the fluorocarbon gas is from about 1:1 to 2:1. The main etch step provides a low-k dielectric etch rate higher than about 4000 Å/min and etching selectivity with respect to the photoresist mask higher than about 2:1.

The over etch step is performed after the main etch step to clear away any residual dielectric material left in the feature 101, such as, for example, at the bottom surface 106 and bottom corners 109 of the feature 101. Because of etch rate non-uniformity and etch rate microloading that usually accompany the main etch step, the amount of residual dielectric layer left at the bottom surface 106 of feature 101 after the main etch step may depend on the size of feature 101, where the feature is located on substrate 150 (e.g., near center or edge of substrate 150), and whether feature 101 is an isolated feature or among a group of other closely spaced features. The over etch step need to be performed for a sufficiently long period of time in order to clear the residual dielectric layer left at the bottom surfaces and bottom corners of all of the features on substrate 150. During this period of time, mask layer 110 is further consumed and barrier/liner layer 130 in many features that had thinner residual dielectric layer left after the main etch step may be exposed to the etching plasma of the over etch step. Therefore, it is critical that the over etch step should provide high etching selectivities to both mask layer 110 and barrier/liner layer 130.

Figure 3:
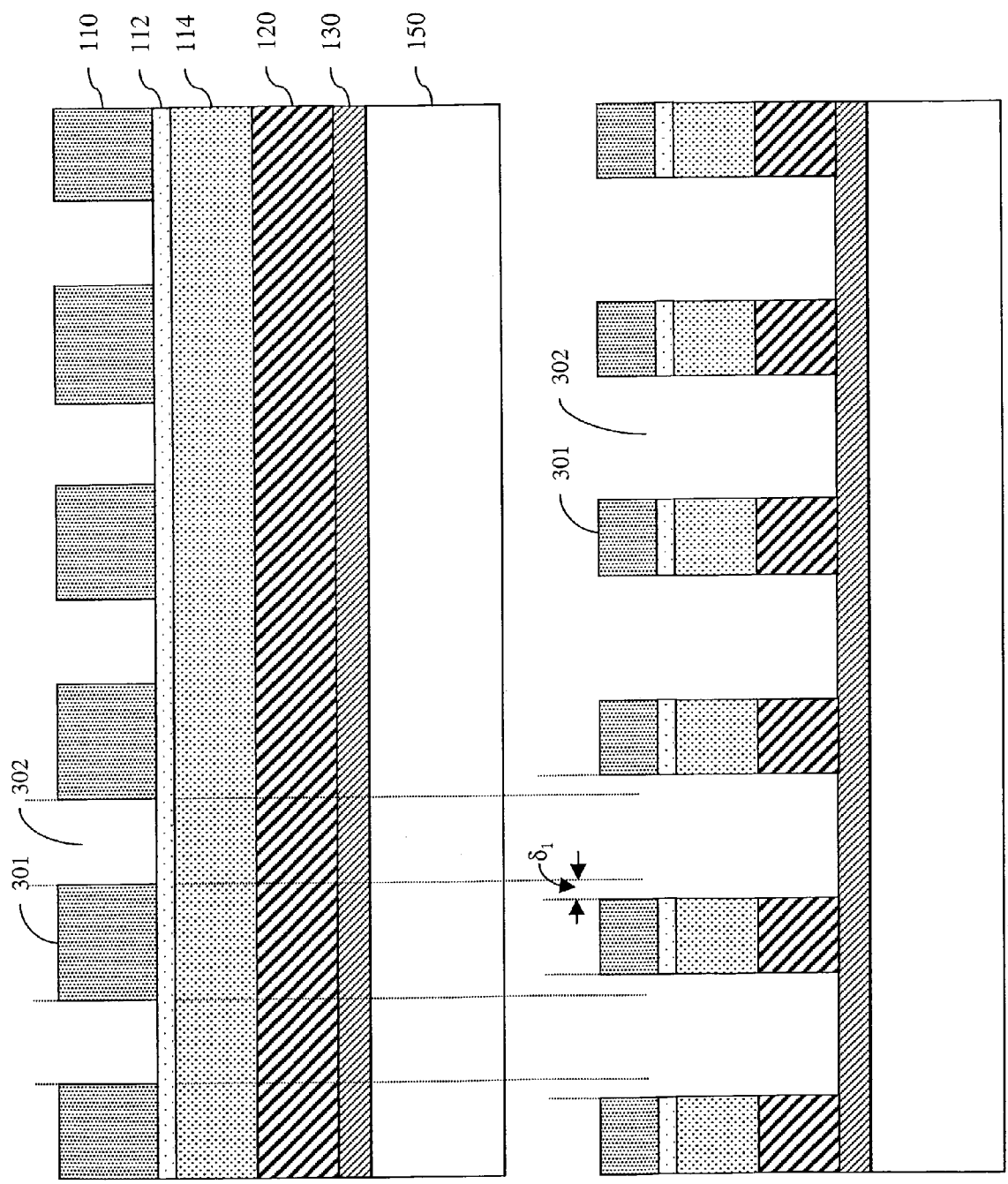
FIGS. 3A and 3B are schematic cross-sectional views of a group of line and space features before and after a conventional low-k dielectric etching process, respectively.
Figure 4:
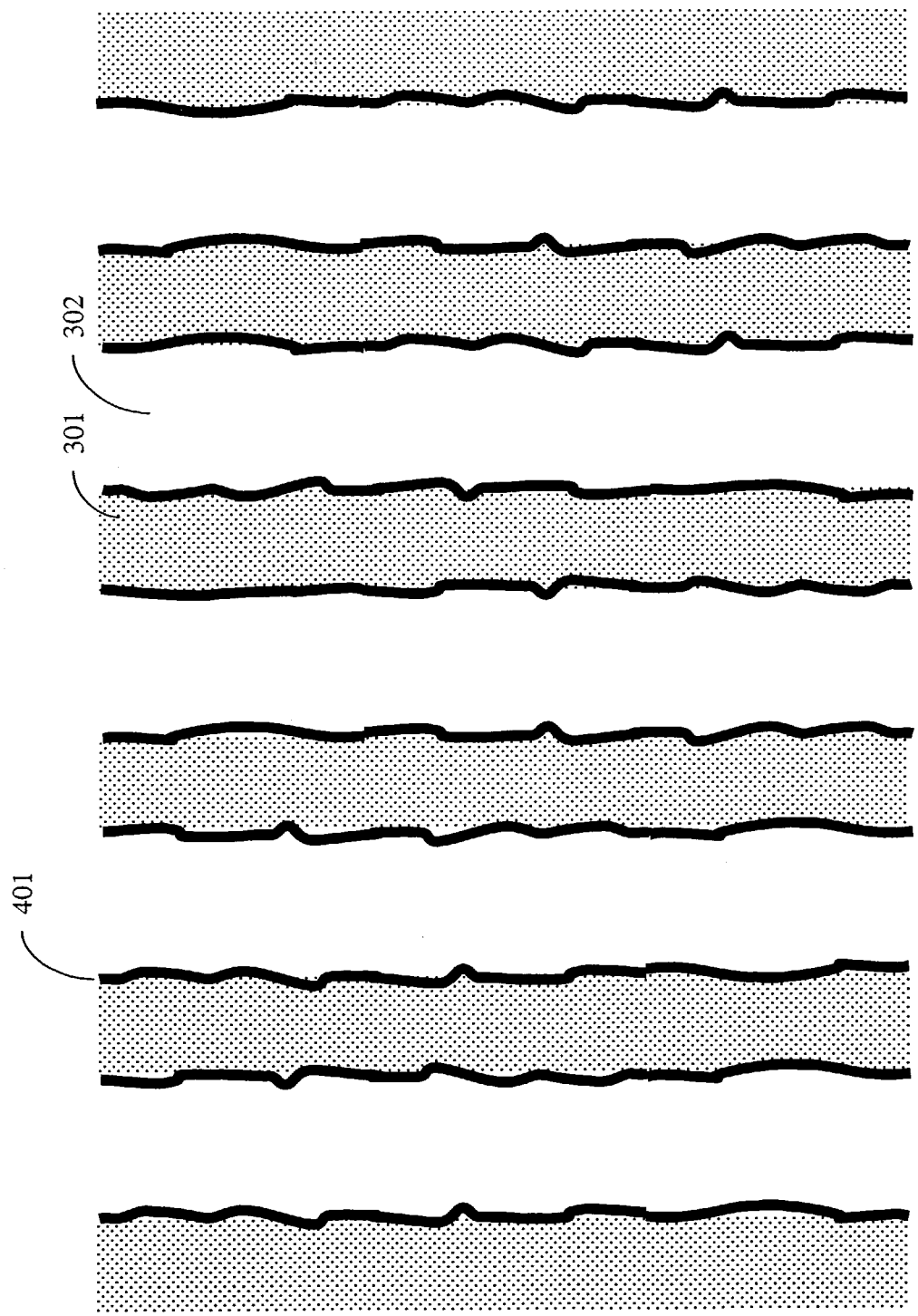
FIG. 4 is a schematic top view of the group of line and space features after a conventional low-k dielectric etching process.

FIGS. 3A and 3B are schematic cross-sectional views of a group of line and space features on substrate 150 before and after a conventional dielectric etching process, respectively. The lines are being denoted by reference numeral 301 and the spaces are being denoted by reference numeral 302. The conventional dielectric etching process includes an over etch step that uses a $C_4F_6/O_2/Ar$ process gas mixture, which has a dielectric to photoresist etching selectivity as low as 1.5:1, due partly to the presence of $O_2$ in the process gas. The poor selectivity to photoresist results in severe CD loss, which is shown as $\delta_1$ in FIG. 3B. The over etch step in the conventional low-k dielectric etching process also results in severe striations on the sidewalls of the etched features. FIG. 4 is a schematic top view of the group of line and space features shown in FIG. 3B after removal of the mask layer 110 and the BARC layer 112. As shown in FIG. 4, the etched low-k dielectric layer 120 has rough sidewall surfaces as indicated by contour lines 401.

The present invention provides an over etch step that has much higher selectivity to mask layer 110 than the over etch step in the conventional dielectric etching process. In the over etch step in one embodiment of the present invention, the process gas comprises a fluorocarbon gas having a relatively low fluorine to carbon ratio, such as $C_4F_6$, $C_5F_8$, $C_3F_6$, etc., and a nitrogen-containing gas, such as $N_2$, wherein the volumetric flow ratio of nitrogen-containing gas to fluorocarbon gas is greater than about 20:1, and more typically greater than about 30:1. The process gas may further comprise an inert gas, such as Ar, with the volumetric flow ratio of inert to nitrogen-containing gas being about 3:1 to about 6:1.

The over etch step of the present invention provides a low-k dielectric etch rate higher than about 1400 Å/min, etching selectivity with respect to the photoresist mask higher than about 4.8:1, and etching selectivity with respect to the barrier/liner material higher than about 6:1. By proper mixing of the fluorocarbon gas with the nitrogen-containing gas, selectivity higher than about 7:1 to both the mask layer 110 and the barrier/liner layer 130 may be achieved. Typically, a higher volumetric flow ratio of nitrogen-containing gas to fluorocarbon gas results in higher selectivity to photoresist.

Figure 5A:
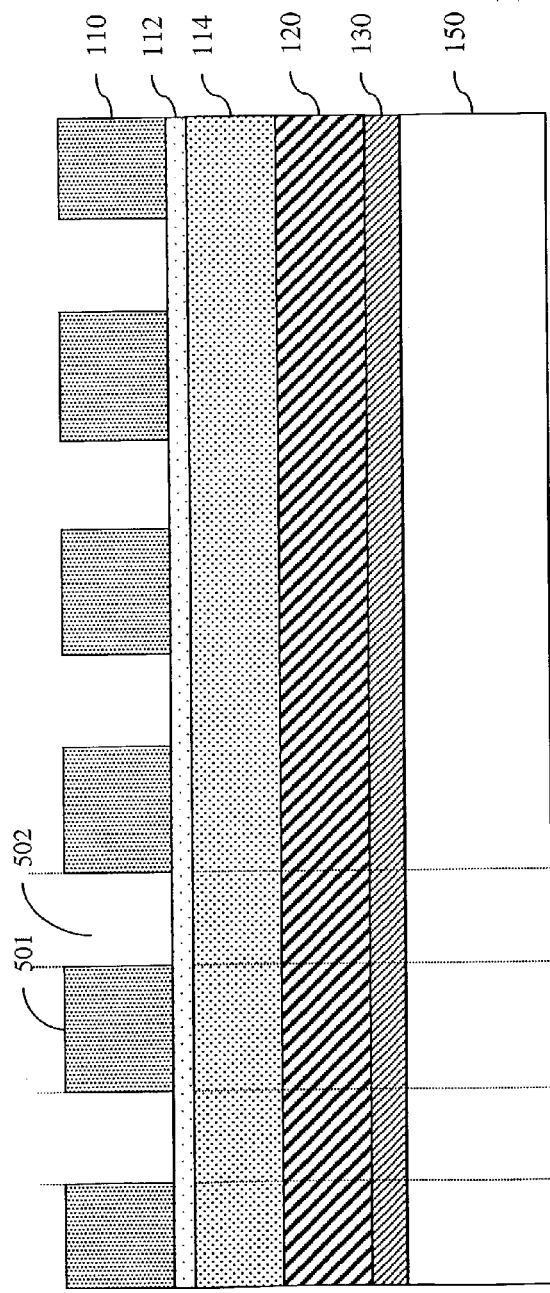
FIGS. 5A and 5B are schematic cross-sectional views of a group of line and space features before and after a low-k dielectric etching process, respectively, according to one embodiment of the present invention.
Figure 5B:
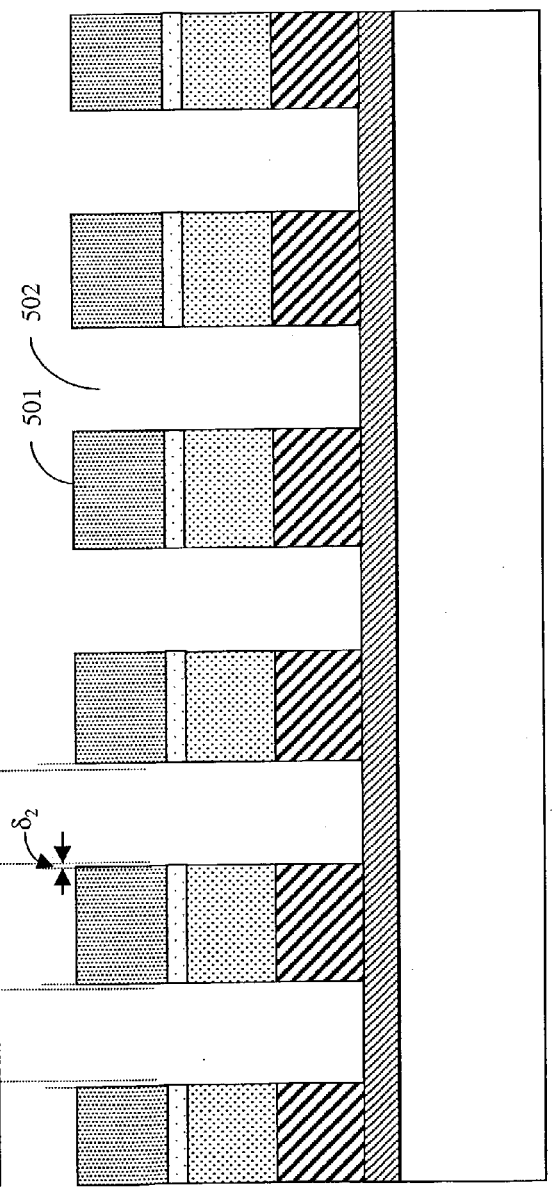
Figure 6:
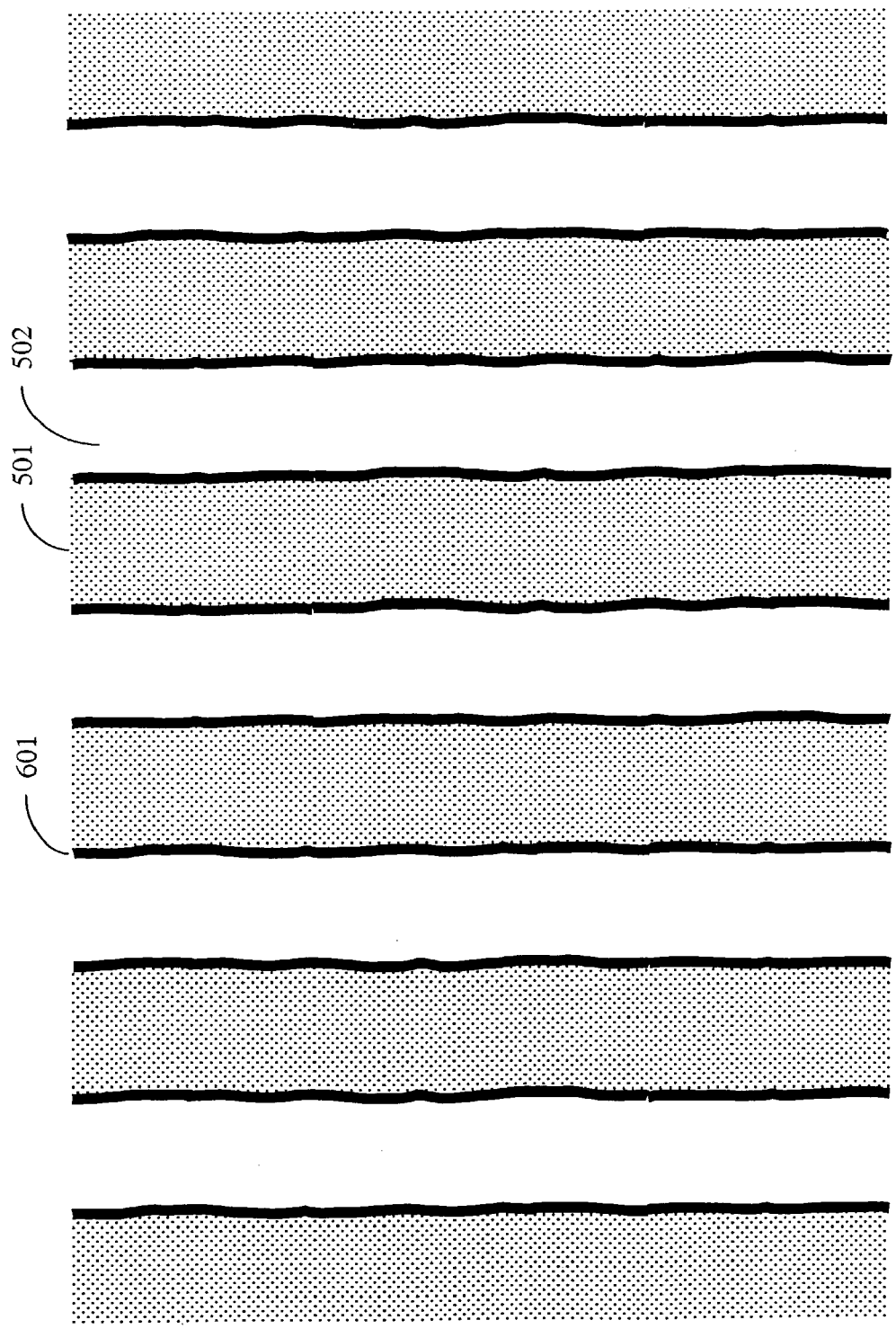
FIG. 6 is a schematic top view of the group of line and space features after a low-k dielectric etching process according to one embodiment of the present invention.

Because of the much improved selectivity to photoresist, the over etch step of the present invention provides much reduced CD loss as compared with the over etch step in the conventional dielectric etching process. FIGS. 5A and 5B are schematic cross-sectional views of a group of line and space features on substrate 150 before and after the dielectric etching process, respectively, according to one embodiment of the present invention. The lines are being denoted by reference numeral 501 and the spaces are being denoted by reference numeral 502. As shown in the Figures, the CD loss $\delta_2$ in FIG. 5B is much less than the CD loss $\delta_1$ shown in FIG. 3B. The over etch step according to one embodiment of the present invention also results in much reduced striations. As shown in FIG. 6, which is a schematic top view of the group of line and space features shown in FIG. 5B after removal of the mask layer 110 and the BARC layer 112, the etched dielectric sidewall surfaces as indicated by contour lines 601 in FIG. 6, are much smoother than those shown in FIG. 4. The over etch step of the present invention also results in much reduced resist loss, making it possible to use thinner mask layer 110, which is necessary in some cases in order to meet lithography-related challenges posed by smaller feature sizes.

Other gases may also be included in the over etch step of the dielectric etching process. For example, a certain amount of fluorocarbon gas having relatively high fluorine to carbon ratio, such as $CF_4$, $C_2F_6$, $C_3F_8$, $C_4F_{10}$, $C_4F_8$, $CHF_3$, etc., may be added to enhance the dielectric etch rate, with some sacrifice to the etching selectivities to both the mask layer and the barrier/liner layer. Also, adding a carbon-oxygen gas such as carbon monoxide (CO) in the process gas in the over etch step helps to improve the etching selectivity with respect to the barrier/liner layer.

EXAMPLES

The following examples illustrate use of the present invention for etching the low-k dielectric layers 120 on the semiconductor substrate 150. An example of the semiconductor substrate 150 is a silicon wafer of 200 mm (8 inch) or 300 mm (12 inch) diameter. As shown in FIG. 1(a), the wafer 150 is coated successively with a low-k barrier/liner layer 130 having a thickness of about 500 Å, a low-k dielectric layer 120 having a thickness of about 2000 Å, a hard mask layer 114 of about 2000 Å, a BARC layer 112 of about 900 Å, and a mask layer 110 of about 4750 Å that is patterned to define features such as feature 101 to be etched.

In the following examples, the mask layer 110 is photoresist, such as "RISTON," manufactured by duPont de Nemours Chemical Company. The BARC layer 112 may be any conventional organic BARC that can be spin-applied to a substrate. The hard mask 114 is a conventional tetra-ethyl-ortho-silicate (TEOS) based oxide film. The low-k dielectric layer 120 is a Black Diamond™ low-k dielectric layer formed with a chemical vapor deposition (CVD) or plasma enhanced CVD process using $SiH_2F_2$ or $CH_3SiH_3$ as a precursor gas. The low-k barrier/liner layer 130 is a BLOk™ (barrier low-k) film, which is a silicon carbide film formed using the chemical vapor deposition (CVD) or plasma enhanced CVD process described in commonly owned U.S. Pat. No. 6,287,990 B 1, issued Sep. 11, 2001, and U.S. Pat. No. 6,303,523 B2, issued Oct. 16, 2001, which are incorporated herein by reference. Various layers of the same or other materials may lie under the BLOk™ layer, which should not affect the practice of the present invention.

A conventional BARC etch process and a conventional hard mask etching process can be performed to clear away the BARC layer 112 and the hard mask layer 114 at the feature openings before etching the low-k dielectric layer.

During the dielectric etching process, the substrate 150 is placed on the pedestal 230 of the reactor 200, and the chamber 210 is maintained at a pressure of about 50–200 mTorr (mT). Process gas comprising the particular gas compositions described below is introduced into the process chamber 210. A plasma that etches the dielectric layer 120 on the substrate 150 is maintained in the process zone 201 by applying a RF voltage to the pedestal 230. A rotating magnetic field (B-field) of about 0–40 Gauss can also be applied to the process zone 201 to enhance the plasma density.

The wafer 150 is maintained at a temperature sufficiently high to volatilize most of the etch products, and sufficiently low so that a layer of passivating deposits and etch product deposits is retained on the sidewalls 105 of freshly etched feature 101. Typically, the substrate 150 is kept at a temperature of about 15° C. using a flow of helium on the backside of the substrate 150. The pressure of the backside helium is maintained at about 16 Torr in the main etch step and at about 8 Torr in the over etch step. The chamber wall 212 is also kept at a temperature of about 15° C. using a conventional cooling or heating mechanism as necessary for maintaining the chamber wall temperature.

The dielectric etching process comprises a main etch step followed by an over etch step. The main etch step is performed for a sufficient time to etch through the low-k dielectric layer 120 on the substrate 150, and is terminated after a predetermined time period or by using an optical endpoint measurement technique. The over etch step clears away any residual low-k dielectric layer left in the etched features.

Scanning electron micrograph (SEM) photos of etched 200 mm test wafers were used to measure the etch rate and etching selectivity, and to observe CD loss and striations. In the examples herein, etch rates were measured in 0.18 µm trenches. Table I lists exemplary values of process parameters used during BARC etching, hard mask etching, and the dielectric main etch step. Table II lists ranges (i.e., minimum and maximum values) and exemplary values of the process parameters for the over etch step of the present invention. Table III lists measured etch rates and etching selectivities during the two exemplary over etch steps with the process parameters listed in Table II.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

TABLE I

| Film | Process Gas Flow (sccm) | | | | Pressure (mT) | RF Power (W) | B-Field (G) |
|---|---|---|---|---|---|---|---|
| BARC | $O_2$ 5 | $CF_4$ 40 | $CHF_3$ 20 | Ar 100 | 20 | 800 | 30 |
| Hard Mask | $C_2F_6$ 20 | | | Ar 100 | 100 | 1200 | 0 |
| Low-k Dielectric (Main Etch) | $N_2$ 20 | $CF_4$ 80 | | Ar 100 | 200 | 500 | 0 |

TABLE II

Low-k Dielectric Over Etch

| Process Parameters | Minimum | Maximum | Example 1 | Example 2 |
|---|---|---|---|---|
| Process Gas (sccm) | | | | |
| $C_4F_6$ | 3 | 10 | 5 | 4 |
| $C_2F_6$ | 3 | 10 | 0 | 4 |
| $N_2$ | 150 | 250 | 200 | 160 |
| Ar | 600 | 1200 | 900 | 900 |
| RF Power (W) | 700 | 1200 | 800 | 800 |
| B-Field (V) | 0 | 30 | 30 | 30 |
| Pressure (mTorr) | 50 | 150 | 100 | 100 |

TABLE III

| | Low-k Dielectric Etch Rate (Å/min) | Selectivity to Photoresist | Selectivity to Blok layer |
|---|---|---|---|
| Over Etch (Example 1) | 1400 | 6.1:1 | 7.9 |
| Over Etch (Example 2) | 1916 | 4.8:1 | 6.4 |

What is claimed is:

1. A method of selectively etching a low-k dielectric layer, the method comprising:
   providing a flow of a process gas into a process zone in which the low-k dielectric layer masked by a photoresist material is located, the process gas including a first fluorocarbon gas having a relatively low fluorine to carbon ratio, a nitrogen-containing gas, and an inert gas, wherein a volumetric flow ratio of the nitrogen-containing gas to the first fluorocarbon gas is greater than 30:1; and
   maintaining a plasma of the process gas to etch the low-k dielectric layer with a low-k dielectric to photoresist etching selectivity ratio greater than about 4.8:1, and a low-k dielectric etch rate greater than about 1400 Å/min.

2. The method of claim 1 wherein the first fluorocarbon gas is selected from the group consisting of $C_4F_6$, $C_5F_8$, $C_3F_6$, and mixtures thereof.

3. The method of claim 1 wherein the nitrogen-containing gas is selected from the group consisting of $N_2$, $NH_3$, $N_2O$, and mixtures thereof.

4. The method of claim 1 wherein the inert gas is selected from the group consisting of argon, xenon, neon, krypton, and helium.

5. The method of claim 1 wherein the low-k dielectric layer comprises doped silicon dioxide.

6. The method of claim 1 wherein the low-k dielectric layer comprises a film formed by a chemical vapor deposition process using a precursor gas selected from $SiH_2F_2$ and $CH_3SiH_3$.

7. The method of claim 1 wherein the low-k dielectric layer is over a substrate placed on a pedestal in a plasma etch chamber, and wherein maintaining the plasma of the process gas comprises capacitively coupling RF power into the plasma etch chamber such that a substantial DC bias exists between the pedestal and the plasma.

8. The method of claim 1 wherein the dielectric layer is etched through a patterned mask of photoresist material.

9. The method of claim 1 wherein the first fluorocarbon gas is $C_4F_6$, the inert gas is argon, and the nitrogen-containing gas is $N_2$.

10. The method of claim 9 wherein a volumetric flow ratio of argon to $N_2$ is in the range of 3:1 to 6:1.

11. The method of claim 1 wherein the process gas further comprises a second fluorocarbon gas having a relatively high fluorine to carbon ratio.

12. The method of claim 11 wherein the second fluorocarbon gas is selected from the group consisting of $CF_4$, $C_2F_6$, $C_3F_8$, $C_4F_{10}$, $C_4F_8$, $CHF_3$, and mixtures thereof.

13. A method for selectively etching a substrate having a low-k dielectric layer thereon, comprising:
   providing a flow of a first process gas into a process zone of a process chamber in which the low-k dielectric layer is located, the first process gas including a first fluorocarbon gas having a relatively high fluorine to carbon ratio;
   maintaining a plasma of the first process gas in the chamber for a first period of time to etch the low-k dielectric layer;
   providing a flow of a second process gas into the process zone, the second process gas including a nitrogen-containing gas and a second fluorocarbon gas having a relatively low fluorine to carbon ratio, wherein a volumetric flow ratio of the nitrogen-containing gas to the second fluorocarbon gas is greater than about 20:1; and
   maintaining a plasma of the second process gas in the chamber for a second period of time to etch the low-k dielectric layer.

14. The method of claim 13 wherein the first fluorocarbon gas is selected from the group consisting of $CF_4$, $C_2F_6$, $C_3F_8$, $C_4F_{10}$, $C_4F_8$, $CHF_3$, and mixtures thereof.

15. The method of claim 13 wherein the second fluorocarbon gas is selected from the group consisting of $C_4F_6$, $c_5F_8$, $C_3F_6$, and mixtures thereof.

16. The method of claim 13 wherein the nitrogen-containing gas is selected from the group consisting of $N_2$, $NH_3$, $N_2O$, and mixtures thereof.

17. The method of claim 13 wherein the second process gas further comprises an inert gas.

18. The method of claim 13 wherein the second fluorocarbon gas is $C_4F_6$, the nitrogen-containing gas is $N_2$, the inert gas is argon, and the volumetric flow ratio of $N_2$ to $C_4F_6$ is greater than 30:1.

19. The method of claim 1 wherein the dielectric layer is etched through a patterned mask of photoresist material.

20. The method of claim 19 wherein the second process gas further includes a third fluorocarbon gas having a fluorine to carbon ratio higher than that of the second fluorocarbon gas.

* * * * *

UNITED STATES PATENT AND TRADEMARK OFFICE
CERTIFICATE OF CORRECTION

PATENT NO. : 7,229,930 B2 Page 1 of 1
APPLICATION NO. : 10/341693
DATED : June 12, 2007
INVENTOR(S) : Jain et al.

It is certified that error appears in the above-identified patent and that said Letters Patent is hereby corrected as shown below:

In column 3, line 25, delete "cm3." and insert -- $cm^3$. --, therefor.

In column 6, line 37, after "6:1." insert -- Suitable nitrogen-containing gases include $N_2$, $NH_3$, $N_2O$, etc., of which $N_2$ is most often used. Suitable inert gases include argon, helium, neon, xenon, and krypton, of which argon is most often used. --.

In column 7, line 42, delete "B 1," and insert -- B1, --, therefor.

In column 10, line 42, in Claim 15, delete "$c_5F_8$," and insert -- $C_5F_8$, --, therefor.

In column 10, line 52, in Claim 19, delete "claim 1" and insert -- claim 13 --, therefor.

In column 10, line 54, in Claim 20, delete "claim 19" and insert -- claim 18 --, therefor.

Signed and Sealed this

Second Day of October, 2007

JON W. DUDAS
*Director of the United States Patent and Trademark Office*